United States Patent [19]

Rich

[11] Patent Number: 4,876,685
[45] Date of Patent: Oct. 24, 1989

[54] FAILURE INFORMATION PROCESSING IN AUTOMATIC MEMORY TESTER

[75] Inventor: Marc A. Rich, Chatsworth, Calif.
[73] Assignee: Teradyne, Inc., Boston, Mass.
[21] Appl. No.: 59,550
[22] Filed: Jun. 8, 1987
[51] Int. Cl.$^4$ .............. G01R 31/28; G06F 11/00
[52] U.S. Cl. .................... 371/21.6; 371/24; 371/27; 371/29.1
[58] Field of Search .............. 324/73 R, 73 AT; 371/20, 21, 25, 10, 27, 24, 29

[56] References Cited

U.S. PATENT DOCUMENTS

| 4,450,560 | 5/1984 | Conner | 371/25 |
| 4,451,918 | 5/1984 | Gillette | 371/27 |
| 4,736,373 | 4/1988 | Schmidt | 371/10 |

OTHER PUBLICATIONS

Kurth, R., et al., "Universal Physical Memory Bit Fail Map", IBM Technical Bulletin, vol. 26, No. 11, Apr. 1984, pp. 5996-6000.

Primary Examiner—Jerry Smith
Assistant Examiner—Stephen M. Baker

[57] ABSTRACT

Automatic memory tester apparatus for processing failure information of a memory under test (MUT) including a high speed pattern generator for providing digital test patterns to the MUT for storage of data at MUT addresses in the MUT, a failure processor for comparing outputs from the MUT with expected outputs to obtain failure information, and a fail map random access memory (RAM) having fail map addresses corresponding to the MUT addresses and connected to receive the failure information and store it at corresponding fail map addresses. The fail map addresses includes bits to address individual bits of multibit words. An address generator of the high speed pattern generator for randomly addresses and reads individual bits of the multibit words to provide a serial bit output for display. Relative positions of the display related to topical positions of associated memory elements on the MUT.

10 Claims, 4 Drawing Sheets

FIG 3

SCAN ADDRESS TRANSFORMATION TABLE

| Y ADDRESS | SCAN ADDRESS IN | SCAN ADDRESS OUT |
|---|---|---|
| 0 | 0 | 0 |
| 0 | 1 | 1 |
| 0 | 2 | 2 |
| 0 | 3 | 3 |
| 1 | 0 | 3 |
| 1 | 1 | 2 |
| 1 | 2 | 1 |
| 1 | 3 | 0 |

FAILURE INFORMATION PROCESSING IN AUTOMATIC MEMORY TESTER

FIELD OF THE INVENTION

The invention relates to processinq failure information in automatic memory testers.

BACKGROUND OF THE INVENTION

In automatic circuit testers for testing random access memories (RAMs) or logic including RAMs, digital test patterns (multibit words for both the address and data) are provided at high speed (e.g., up to 50 MHz) to the address and data pins of a memory under test (MUT); the MUT is read, and the outputs are compared with the inputs. Failures are stored in a fail map RAM (also referred to as a catch RAM) having addresses that correspond to the addresses of the MUT. After testing, the computer reads the fail map RAM one word at a time, and uses the failure information, e.g, to identify the topical location of the failed memory elements to attempt to correlate the failures to processinq of the memories or to replace failed memory elements with redundant elements. The errors in the fail map RAM are also sometimes counted, and in some instances the high-speed pattern generator has been used to scan the fail map RAM at high speed in counting errors.

Sequences of addresses often do not correspond to the topical locations in the memories, and bits of multibit words may be read in different order for different addresses, requiring that there be further analysis of the failure information in the fail map RAM, using software, to present the failure information in a desired format to provide useful information. Software has also been used to compress the failure information to indicate that there is at least one failure in a group of memory elements. The group can then be analyzed further to identify the precise failed element.

SUMMARY OF THE INVENTION

In general the invention features providing a fail map RAM of a memory tester with address bits to randomly address individual bits of multibit words one bit at a time, to provide a serial bit stream in any desired order, to facilitate processing of the failure information, e.g., providing topical displays or analyzing one data channel (i.e., a particular bit of a multibit word) at a time.

In preferred embodiments a high speed pattern generator that is used to provide addresses and data to the MUT is also used after testing to provide addresses to the fail map RAM to scan it one bit at a time at high speed; a descramble RAM is used to look up addresses of the individual bits of the fail map RAM; there is a shift register that receives the serial bit stream from the fail map RAM, and a computer used in display reads blocks of data from the shift register; there is a data compressor between the fail map RAM and the shift register, and there is a flag register written to and read by the computer and the pattern generator to synchronize operation of the two at high speed.

Other advantages and features of the invention will be apparent from the following description of a preferred embodiment thereof and from the claims.

DESCRIPTION OF THE PREFERRED EMBODIMENT

The preferred embodiment will now be described.

DRAWINGS

FIG. 3 is a diagram illustrating operation of the FIG. 1 apparatus.

STRUCTURE

Figure 1:
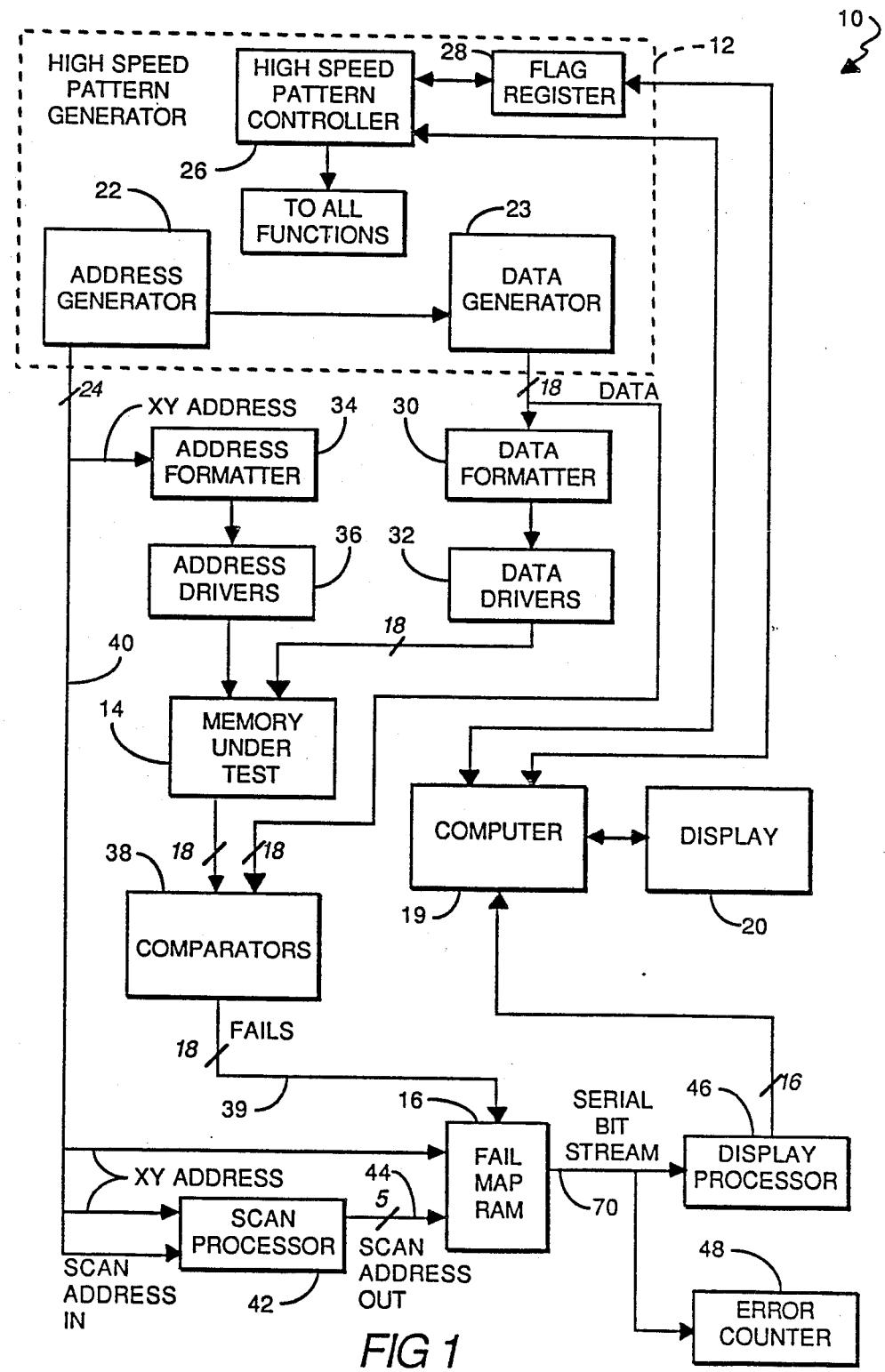
FIG. 1 is a block diagram of components of an automatic memory tester according to the invention.

Referring to FIG. 1., automatic memory tester 10 includes high-speed pattern generator 12 for providing digital test patterns to memory under test (MUT) 14 and fail map random access memory (RAM) 16 for storing the failure information provided to it. Computer 19 provides overall control to apparatus 10 and displays the failure information at visual display 20, a CRT.

High-speed pattern generator 12 includes address generator 22, for providing XY addresses to MUT 14 and fail map RAM 16, and data generator 23, for providing the data to be sent to MUT 14 simultaneously with respective addresses. Address generator 22 and data generator 23 are controlled by high speed pattern controller 26, which also provides control for all of the other components employed in high-speed testing and scanning. High speed pattern generator 12 operates at up to 50 MHz, in order to test MUT 14 at normal operating speeds and to evaluate errors as a function of the rate of writing data into MUT 14. Data generator 23 provides an 18-bit wide output, which can be dependent on the address (algorithmic), can be selected from a data set RAM (not shown), or can be selected from a ROM data generator (a RAM used when testing ROMs, not shown). High-speed pattern generators are well known in the art, for example, as disclosed on Conner U.S. Pat. No. 4,450,560 and Gillette U.S. Pat. No. 4,451,918. High-speed pattern generator 12 also includes flag register 28 that is connected to be written to and read by both high-speed pattern controller 26 and computer 19.

The 18-bit output of data generator 23 is provided to MUT 14 via data formatter 30 and data drivers 32. The XY addresses provided from address generator 22 are provided to MUT 14 via address formatter 34 and address drivers 36.

The output of MUT 14 is provided to comparators 38, which compare the output from MUT 14 with data from data generator 23 and provide failure information over 18-bit bus 39 to fail map RAM 16.

As explained in more detail below, address bus 40 is used to carry both X and Y addresses and scan addresses (bits used to address individual bits of multibit words), the latter being used by scan processor 42, which in turn provides scan address bits over 5-bit wide bus 44 to fail map RAM 16. Serial bit output line 70 of fail map RAM 16 is connected to both display processor 46 and error counter 48. The 16-bit output of display processor 46 is provided to computer 19.

Figure 2:
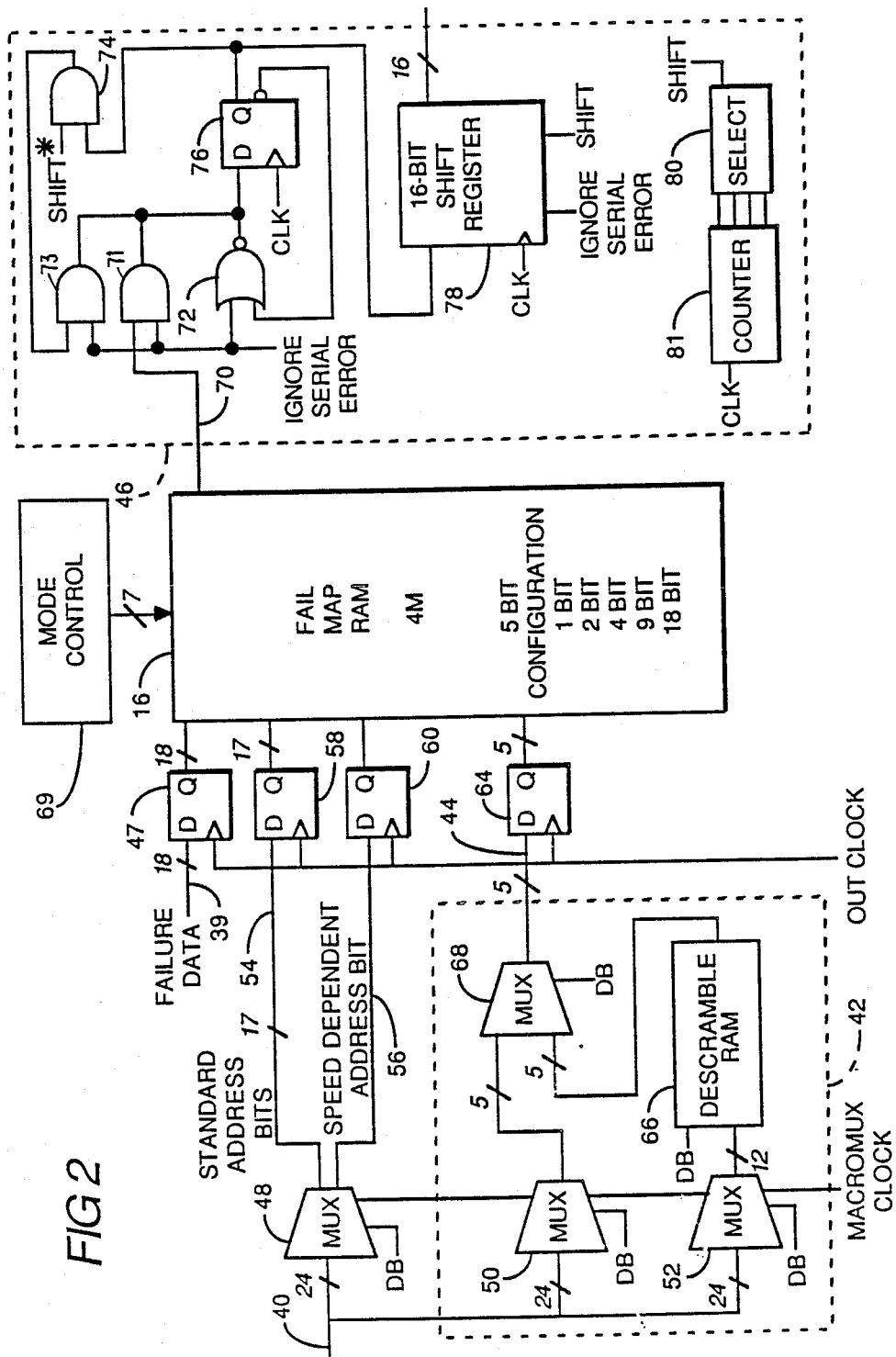
FIG. 2 is a block diagram of the fail map memory, the scan processor, and the display processor of the FIG. 1 tester.

Referring to FIG. 2, it is seen that failure information bus 39 is connected to latch register 47, and 24-bit address bus 40 is connected to 24-to-18 multiplexer 48 (eighteen 24-to-1 multiplexers), 24-to-5 multiplexer 50 (five 24-to-1 multiplexers), and 24-to-12 multiplexer 52

(twelve 24-to-1 multiplexers). The 18-bit output of multiplexer 48 is used to provide the XY addresses over 17-bit wide bus 54 and line 56 to fail map RAM 16 via latch registers 58, 60, for use in latching (writing fail information to) and scanning (reading) fail map RAM 16. Scan processor 42 provides a scan address output (up to 5 bits) via latch register 64 to fail map RAM 16 to address individual bits of multibit words stored there. When the scan address bits come directly from address generator 22, they are selectively provided by multiplexer 50. When the scan address bits are a function of the XY address, up to 12 lines of 24-bit bus 40 are selected by multiplexer 52 and provided to descramble RAM 66, which is used to look up the desired scan address. Ten-to-five multiplexer 68 (five 2-to-1 multiplexers) is connected to receive the outputs from multiplexer 50 and descramble RAM 66 and to selectively provide one to register 64.

Fail map RAM 16 has 4M storage 16 and is controlled by mode control 69 to provide the latching and scanning modes and 5 different bit configurations—1 bit, 2 bit, 4 bit, 9 bit, and 18 bit. Simultaneous testing of a plurality of memories is possible when in the 9 bit or smaller configurations. Serial bit output on line 70 is provided to and gate 71 of display processor 46. The output of and gate 71 is tied with the outputs of nor gate 72 and and gate 73 and provided to flip flop 76, the output of which is provided to and gate 74 and 16-bit shift register 78. The output of and gate 74 is fed back to and gate 73, and the complement of the output of flip flop 76 is fed back to or gate 72. And gates 71, 73, nor gate 72, and shift register 78 also have an IGNORE SERIAL ERROR input, to ignore bits of the serial bit stream on line 70. Nor gate 72, and gates 71, 73, and 74, and flip flop 76 operate as a 1-to-1, 4-to-1, or 16-to-1 data compressor, depending upon whether the 1, 4, or 16 count from counter 81 is selected by selector 80 as the SHIFT output, as is explained below. The compressed output of flip flop 76 is provided to 16-bit shift register 78, the accumulated 16-bit output of which is provided to computer 19.

Operation

In operation, digital test patterns are generated by data generator 23 and provided via data formatter 30 and data drivers 32 to MUT 14 simultaneously with XY addresses, generated by address generator 22 and provided via address formatter 34 and address drivers 36 at high-speed (up to 50 MHz). MUT 14 is read, and its output is compared by comparators 38 with the data inputs from data generator 23. Failure information is latched into fail map RAM 16 at XY addresses that correspond to those of MUT 14.

Figure 3:
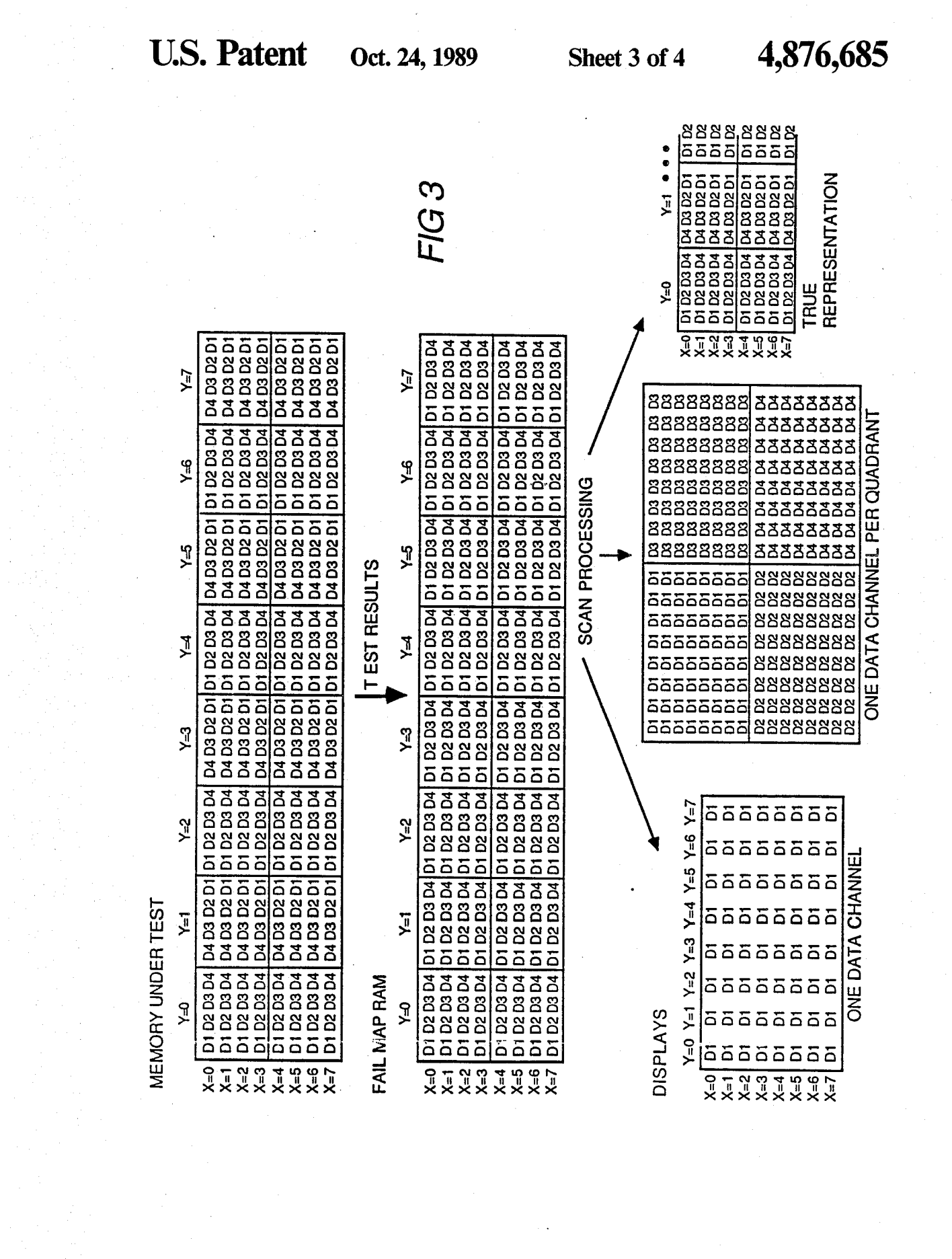

The sequences of address may not correspond to the topical locations in MUT 14, and individual bits of multibits words may be read into MUT 14 in different order for different XY addresses. In FIG. 3 is shown an illustration in which MUT 14 is a 64-bit by 4 RAM; i.e., it stores 64, 4-bit wide words, using X addresses $X_0$ to $X_7$, and Y addresses $Y_0$ to $Y_7$; the individual bits of each word are designated $D_1$ to $D_4$. In MUT 14, the order in which individual bits $D_1$ to $D_4$ of the 4-bit words are stored depends upon the Y address, the bits being stored in order when Y is 0, 2, 4, or 6 and being stored in reverse order when Y is 1, 3, 5, or 7. When the results are stored in fail map RAM 16, the individual bits of the 4-bit words are stored in constant order for all addresses: D1, D2, D3, D4.

After testing, the failure information in fail map RAM 16 is used, for example, to identify the topical locations of failed memory elements, to examine the failure information of selected data channels, or to count the errors. Because failure information is read from fail map RAM 16 one bit at a time, it can be randomly read in any order desired, permitting various displays at display 20 with reduced software processinq by computer 19 and high speed, as fail map RAM 16 is scanned by address generator 22 of high speed pattern generator 12. E.g., as illustrated in FIG. 3, there can be display of one data channel only, one data channel per quadrant, or a true topical representation.

In scanning fail map RAM 16, the scan addresses provided on bus 44 are used to identify the individual bits of multibit words. Depending upon the bit configuration, up to 5 bits are used on scanned address bus 44. Fail map RAM 16 can store up to 18 error channels at once. They can all come from a single memory, for example, one having 18-bit words, or from up to 8 memory devices. Thus MUT 14 on FIG. 1 could, in fact, be a plurality of memory devices.

Figures 4, 5:
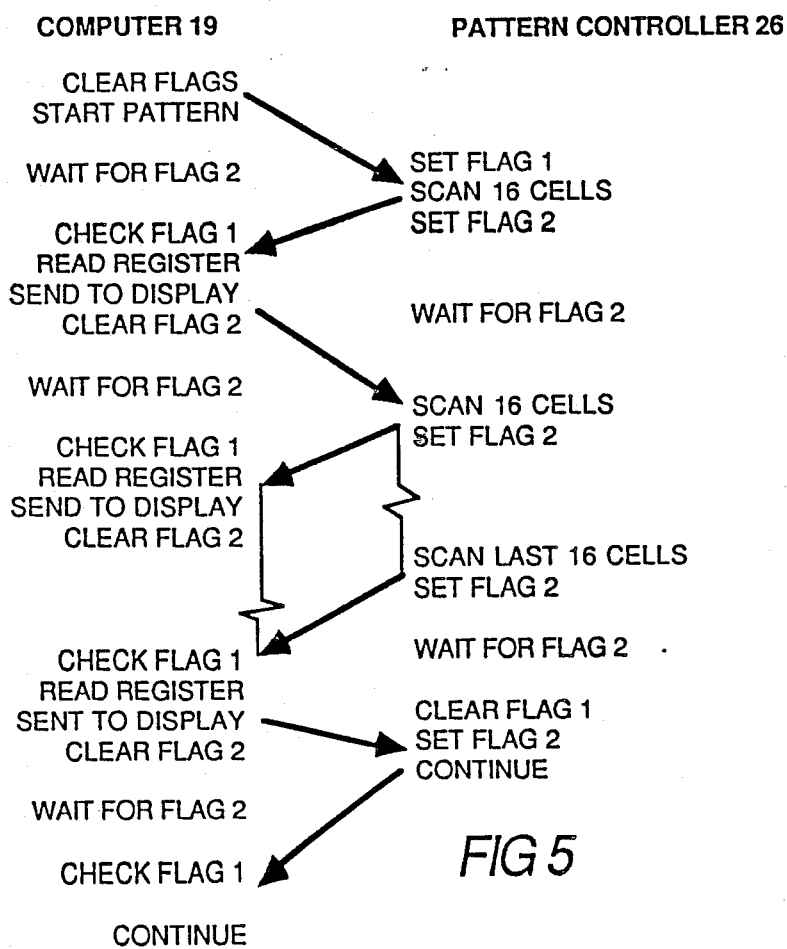
FIG. 4 is a table illustrating operation of a descramble RAM of the scan processor of the FIG. 1 apparatus.
FIG. 5 is a diagram illustrating the passing of control between a computer and high-speed pattern controller of the FIG. 1 apparatus.

If the addresses of the individual bits are generated directly at address generator 22, they are routed through multiplexers 50, 68 to latch register 64 (FIG. 2). The addresses of individual bits can also be generated by reference to a transformation table stored in descramble RAM 66, which is addressed by up to 12 bits on bus 24, at least some of which can be XY address bits. For example, FIG. 4 illustrates a transformation table that can be used with the 64 bit by 4 RAM of the FIG. 3 illustration; FIG. 4 shows using a simple increment sequence (0, 1, 2, 3, 0, 1, 2, 3) for SCAN ADDRESS IN and using descramble RAM 66 to present the proper scan address sequence, SCAN ADDRESS OUT (FIG. 1), dependent on the Y address, to fail map RAM 16. Descramble RAM 66 can thus be used to easily generate complex scanning sequences without requiring address generator 22 to generate complex scanning sequences directly. Prior to scanning, multiplexers 48, 50, 52, 68 are provided with control signals to effect desired routing and descramble RAM 66 is loaded with the transformation table over database lines DB. The standard XY addresses are selected by MUX 48 and provided over 17-bit bus 54 to fail map RAM 16. Speed dependent address bit line 56 is not employed in a "high-speed mode" (up to 50 MHz) but is employed in a "low-speed mode" (up to 25 Mhz), used when employing interleaved addresses (e.g., providing the X part of an address at one clock pulse the Y part of that address on the next clock pulse).

The serial bit stream provided on line 70 is accumulated (with or without compression and with or without ignoring of certain bits) at shift register 78, from which computer 19 reads the scanned failure information 16 bits at a time. Assuming that there is no compression, and that no bits of the serial bit stream are to be ignored, SHIFT* IS LOW (selector 80 providing a high SHIFT pulse on each clock); IGNORE SERIAL ERROR stays high; the resulting outputs of and gate 73 and nor gate 72 are low, and the serial bit stream on line 70 is simply clocked through flip flop 76 and shifted into and accumulated in shift register 78. If there is data compression (assuming again that no bits of the serial bit stream are to be ignored), SHIFT is high at the 4 or 16 counts of counter 1, and the output of flip flop 76 is shifted into register 78 at that time. Between selected counts, any error (high) output at flip flop 76 is maintained, as it causes a high output at and gate 74 (SHIFT* being high when SHIFT is low between selected counts), which high output is fed back through and gate 73 (the other input of which is high) and flip flop 76, overriding any intervening low pulses on serial bit stream 70. If IGNORE SERIAL ERROR goes low, the outputs of and gates 71, 73 are forced to be low, but a high output of flip flop 76 is maintained, because its low complement causes, along with the low IGNORE SERIAL ERROR input, a high output at nor gate 72, which high output is provided as an input to flip flop 76. IGNORE SERIAL ERROR is used when it is easier to write a scanning pattern that includes some bits which are not being displayed and to delete them from the serial bit stream from fail map RAM 16 than it is to generate a scanning pattern that does not include these bits in the first place.

FIG. 5 describes the use of flag register 28 to synchronize the operation of high speed controller 26 and computer 19 during scanning. Flag 1 is used by pattern controller 26 to signal that it is not finished with the full scan. Flag 2 is used to pass control back and forth between pattern controller 26 and computer 19. Computer 19 clears Flags 1 and 2, initiates the scan, and waits for Flag 2. Pattern controller 26 sets Flag 1, scans 16 memory cells, and sets Flag 2, indicating that there are 16 bits in shift register 78 waiting to be read by computer 19, and then waits for Flag 2 to be cleared. Computer 9, seeing Flag 2, then checks Flag 1, reads the register, sends the failure information to display 20, clears Flag 2, and waits for Flag 2. This continues until pattern controller 26 has scanned all desired memory elements, and computer 19 has sent the bits to display 20; at this time pattern controller clears Flag 1, and sets Flag 2, and computer 19 sees (from the cleared Flag 1) that the scan has been completed. Because high speed pattern generator 12 can operate approximately 16 times faster than computer 19 (it thus serially scans 16 bits in the same amount of time it takes computer 19 to read a 16-bit word in one step), computer 19 need not wait long between its successive readings of 16 bits from register 78.

Other Embodiments

Other embodiments of the invention are within the scope of the following claims.

What is claimed is:

1. Automatic memory tester apparatus for processing failure information of a memory under test (MUT) having plural memory elements and associated MUT addresses, said apparatus comprising
    a high speed pattern generator for providing digital test patterns to said MUT for storage of data at said MUT addresses in said MUT,
    a failure processor for comparing outputs from said MUT with expected outputs to obtain failure information,
    a fail map random access memory (RAM) having fail map addresses corresponding to said MUT addresses and connected to receive said failure information and store it at corresponding said fail map addresses, said fail map addresses including bits to address individual bits of multibit words,
    address circuitry means for randomly addressing and reading individual bits of said multibit words to provide a serial bit output in which individual bits are in a different sequence than the sequence in which they are stored in said fail map RAM,
    said different sequence relating to relative topical positions of said memory elements corresponding to individual bits of said serial bit sequences,
    said address circuitry means including an address generator of said high-speed pattern generator connected to address said fail map RAM, and
    means for receiving said serial bit output and visually displaying failure information in a two-dimensional display in which relative positions of display of said individual bits relate to topical positions of associated memory elements on said MUT.

2. The apparatus of claim 1 wherein said address circuitry comprises a descramble RAM for looking up addresses of bits of multibit words of said fail map RAM that correspond to addresses of bits of multibit words of said MUT.

3. The apparatus of claim 1 wherein said means for receiving and visually displaying comprises a computer connected to receive said serial output and a display to receive data from said computer and to visually display it.

4. The apparatus of claim 3 further comprising a shift register connected to receive and accumulate said serial output, and wherein said display is connected to receive serial output in accumulated form from said shift register.

5. The apparatus of claim 1 wherein said means for receiving and visually displaying comprises a computer connected to receive said serial output and a display to receive data from said computer and to visually display it.

6. The apparatus of claim 5 further comprising a flag register written to and read by said computer and said pattern generator.

7. The apparatus of claim 1 further comprising a data compressor to receive groups of bits of said serial bit output and to provide an error bit indicating if any bit of said group indicates an error.

8. The apparatus of claim 7 wherein said data compressor includes a first register that is connected to receive said serial bit output and a resettable feedback loop that maintains an overriding signal at the input of said first register upon detecting an error at the output of said register, said overriding signal being removed at the end of said group of bits, said data compressor including a second register that receives the output of the first register at the end of said group of bits.

9. The apparatus of claim 8 wherein said feed back loop includes an and gate having the output of said first register as one input and a SHIFT signal indicating the end of a group as another input, and said second register also receives said SHIFT signal.

10. The apparatus of claim 1 further comprising an and gate connected to receive said multibit stream and an IGNORE SERIAL ERROR signal causing it to ignore specified bits of said serial bit output.

* * * * *